(12) United States Patent
Yoo et al.

(10) Patent No.: US 10,908,468 B2
(45) Date of Patent: Feb. 2, 2021

(54) DISPLAY DEVICE AND METHOD FOR MANUFACTURING THE SAME

(71) Applicant: Samsung Display Co., Ltd., Yongin-si (KR)

(72) Inventors: Chansol Yoo, Seoul (KR); Seungki Song, Yongin-si (KR); Eon-young Kim, Asan-si (KR); Jaehong Kim, Asan-si (KR); Nam-wook Lee, Seongnam-si (KR); Yanggyu Jang, Cheonan-si (KR); Yongsik Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/456,877

(22) Filed: Jun. 28, 2019

(65) Prior Publication Data

US 2020/0004093 A1 Jan. 2, 2020

(30) Foreign Application Priority Data

Jun. 29, 2018 (KR) ........................ 10-2018-0075167

(51) Int. Cl.
| | | |
|---|---|---|
| G02F 1/1362 | (2006.01) | |
| H01L 27/32 | (2006.01) | |
| H01L 23/00 | (2006.01) | |
| H01L 23/482 | (2006.01) | |
| B24B 9/06 | (2006.01) | |
| H01L 23/15 | (2006.01) | |

(52) U.S. Cl.
CPC ........ *G02F 1/136286* (2013.01); *B24B 9/065* (2013.01); *H01L 23/482* (2013.01); *H01L 24/03* (2013.01); *H01L 24/05* (2013.01); *H01L 24/32* (2013.01); *H01L 24/83* (2013.01); *H01L 27/3276* (2013.01); *H01L 23/15* (2013.01)

(58) Field of Classification Search
CPC .......... G02F 1/136286; G02F 1/13452; H01L 27/3276; H01L 24/05; H01L 23/482; H01L 24/32; H01L 24/83; H01L 24/03; H01L 23/15; B24B 9/065; H05K 2201/10681; H05K 1/147; H05K 2201/10128; G09F 9/30
USPC ....................................................... 257/773
See application file for complete search history.

(56) References Cited

U.S. PATENT DOCUMENTS

| | | |
|---|---|---|
| 8,721,389 B2 | 5/2014 | Jung et al. |
| 9,885,922 B2 | 2/2018 | Song et al. |
| 10,090,334 B2 | 10/2018 | Bae et al. |

(Continued)

FOREIGN PATENT DOCUMENTS

| | | |
|---|---|---|
| KR | 10-1155902 | 6/2012 |
| KR | 10-2017-0097273 | 8/2017 |

(Continued)

*Primary Examiner* — Caleen O Sullivan
(74) *Attorney, Agent, or Firm* — H.C. Park & Associates, PLC

(57) ABSTRACT

A display device including a substrate including: a top surface, a bottom surface, and a plurality of side surfaces connecting the top surface and the bottom surface; a signal line disposed on the top surface; a sidewall electrode in electrical contact with the signal line and disposed on a first side surface of the side surfaces; and a connection electrode in electrical contact with the sidewall electrode and disposed on the first side surface.

18 Claims, 12 Drawing Sheets

(56) References Cited

U.S. PATENT DOCUMENTS

| | | | |
|---|---|---|---|
| 2016/0377905 A1* | 12/2016 | Choi | .................... G02F 1/1339 257/72 |
| 2017/0358602 A1* | 12/2017 | Bae | ....................... H01L 24/08 |
| 2018/0061367 A1 | 3/2018 | Ye et al. | |
| 2019/0049771 A1 | 2/2019 | Ye et al. | |

FOREIGN PATENT DOCUMENTS

| | | |
|---|---|---|
| KR | 10-2017-0135529 | 12/2017 |
| KR | 10-2017-0139211 | 12/2017 |
| KR | 10-2018-0023109 | 3/2018 |
| KR | 10-2019-0018118 | 2/2019 |

\* cited by examiner

DISPLAY DEVICE AND METHOD FOR MANUFACTURING THE SAME

CROSS-REFERENCE TO RELATED APPLICATION

This application claims priority from and the benefit of Korean Patent Application No. 10-2018-0075167, filed on Jun. 29, 2018, which is hereby incorporated by reference for all purposes as if fully set forth herein.

BACKGROUND

Field

Exemplary embodiments of the invention relate generally to a display device, and more specifically, to a display device and a method for manufacturing the same.

Discussion of the Background

When a display device is manufactured, a bonding process of electrically connecting a display panel and a driving chip may be performed in a module assembly apparatus corresponding to back-end equipment. The bonding process may be performed by a chip-on-glass ("COG") bonding method or a tape automated bonding ("TAB") method.

In the COG bonding method, a driving chip may be mounted directly on a gate area and a data area of a display panel to provide electrical signals to the display panel. Generally, the driving chip may be bonded to the display panel by using an anisotropic conductive film ("ACF") in the COG bonding method.

In the TAB method, a tape carrier package on which a driving chip is mounted may be bonded to a display panel. In this method, one end of the tape carrier package may be bonded to the display panel by using an anisotropic conductive film, and another end of the tape carrier package may be bonded to a main circuit board.

Structures in which a tape carrier package is disposed on a side surface of a display panel are being studied to widen a display area of a display device, on which an image is displayed.

The above information disclosed in this Background section is only for understanding of the background of the inventive concepts, and, therefore, it may contain information that does not constitute prior art.

SUMMARY

Exemplary embodiments of the present invention relate to a display device capable of improving connection reliability between a display panel and a circuit board disposed on a side surface of the display panel, and a method for manufacturing the same.

Additional features of the inventive concepts will be set forth in the description which follows, and in part will be apparent from the description, or may be learned by practice of the inventive concepts.

An exemplary embodiment of the present invention provides a display device including a substrate including: a top surface, a bottom surface, and a plurality of side surfaces connecting the top surface and the bottom surface; a signal line disposed on the top surface; a sidewall electrode in electrical contact with the signal line and disposed on a first side surface of the side surfaces; and a connection electrode in electrical contact with the sidewall electrode and disposed on the first side surface.

An overlapping area between the connection electrode and the sidewall electrode may be greater than an overlapping area between the connection electrode and the signal line.

A thickness of the sidewall electrode may be less than a thickness of the signal line.

The display device may further include an auxiliary electrode disposed on the signal line and in electrical contact with the signal line and the connection electrode.

The display device may further include an upper substrate facing the substrate, an upper sidewall electrode disposed on a side surface of the upper substrate which is aligned with the first side surface, and a sealing member disposed between the substrate and the upper substrate and electrically connecting the upper sidewall electrode to the signal line.

The connection electrode may be in electrical contact with the sidewall electrode and the upper sidewall electrode of the upper substrate.

A thickness of the upper sidewall electrode may be less than a thickness of the signal line.

The display device may further include a partition disposed between the substrate and the upper substrate and is further from the first side surface than the sealing member, in a direction toward a second side surface opposite to the first side surface.

The partition may include an organic material.

An overlapping area between the connection electrode and the upper sidewall electrode may be greater than an overlapping area between the connection electrode and the signal line.

The display device may include an input sensing unit disposed on the upper substrate.

The display device may include a circuit board including a driving pad and facing the first side surface, and an adhesive member electrically adhering the driving pad to the connection electrode.

Another exemplary embodiment of the present invention provides a display device including: a first substrate including a top surface, a bottom surface, and a plurality of side surfaces connecting the top surface and the bottom surface; a second substrate facing the top surface of the first substrate; a signal line disposed on the top surface; a sidewall electrode disposed on a side surface of the second substrate which is aligned with a first side surface of the side surfaces of the first substrate; a sealing member disposed between the first substrate and the second substrate and electrically connecting the sidewall electrode to the signal line; a circuit board including a driving pad and facing the first side surface and the side surface of the second substrate; a connection electrode in electrical contact with the sidewall electrode and disposed on the first side surface and the side surface of the second substrate; and an adhesive member electrically adhering the driving pad to the connection electrode.

The sidewall electrode may include a first sidewall portion disposed on the side surface of the second substrate, and a second sidewall portion extending from the first sidewall portion and disposed on a bottom surface of the second substrate. The second sidewall portion may be in electrical contact with the sealing member.

An overlapping area between the connection electrode and the first sidewall portion of the sidewall electrode may be greater than an overlapping area between the connection electrode and the signal line.

The display device may further include a partition disposed between the first substrate and the second substrate and which is further from the first side surface than the sealing member, in a direction toward a second side surface opposite to the first side surface.

A thickness of the sidewall electrode may be less than a thickness of the signal line.

Another exemplary embodiment of the present invention provides a method for manufacturing a display device including: forming a first portion of a pad electrode on a top surface of a substrate, the pad electrode including the first portion extending in one direction and a second portion extending from the first portion; forming the second portion on a side surface of the substrate by grinding the second portion using a grinder; forming a connection electrode on the side surface of the substrate such that the connection electrode is in electrical contact with the second portion; and electrically connecting the connection electrode to a driving pad of a circuit board facing the side surface of the substrate by using a conductive adhesive member.

The grinder may include a grinding member configured to grind the second portion, and a rotation member connected to the grinding member and configured to rotate the grinding member about a rotation axis. The grinding member may grind the second portion in a state in which the grinding member perpendicular to the rotation axis makes a predetermined angle with the top surface of the substrate.

The predetermined angle may be an acute angle.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
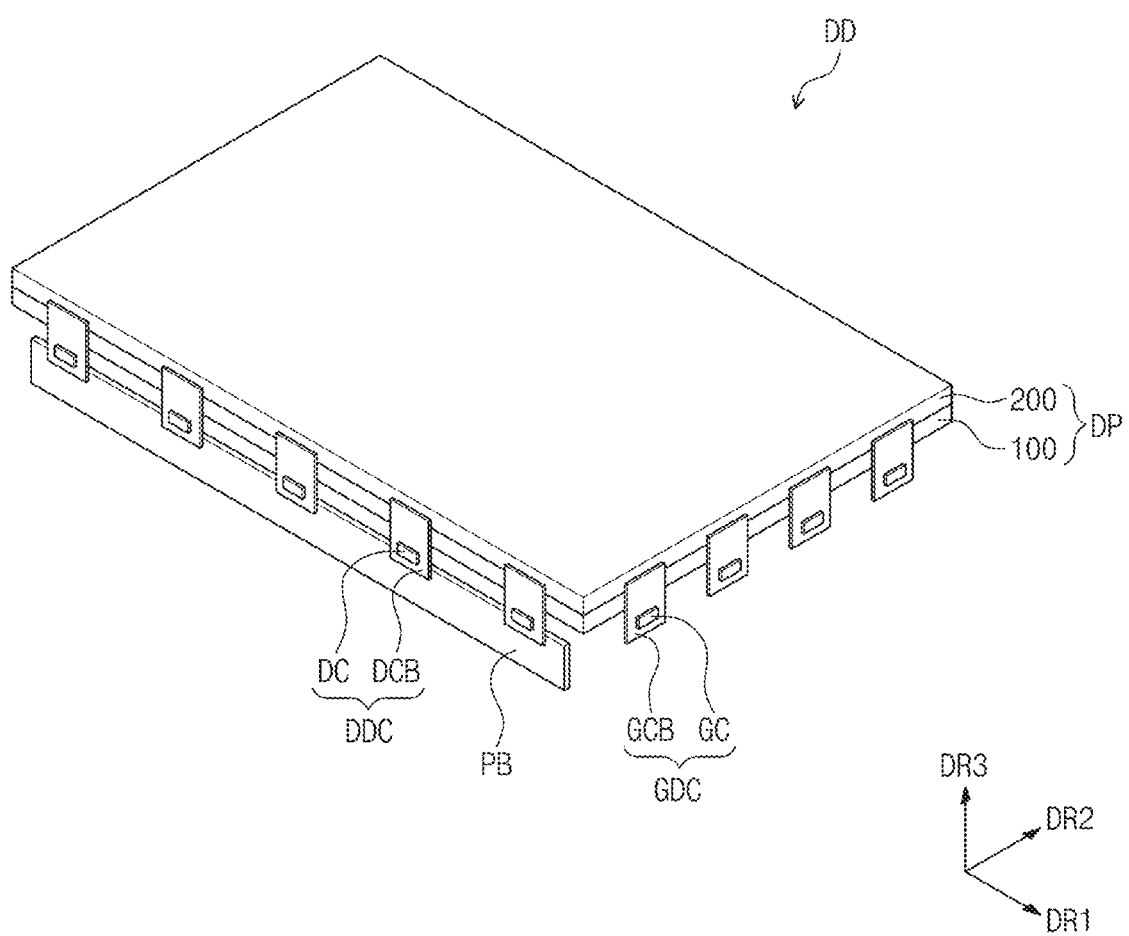
FIG. 1A is a perspective view illustrating a display device according to an exemplary embodiment of present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
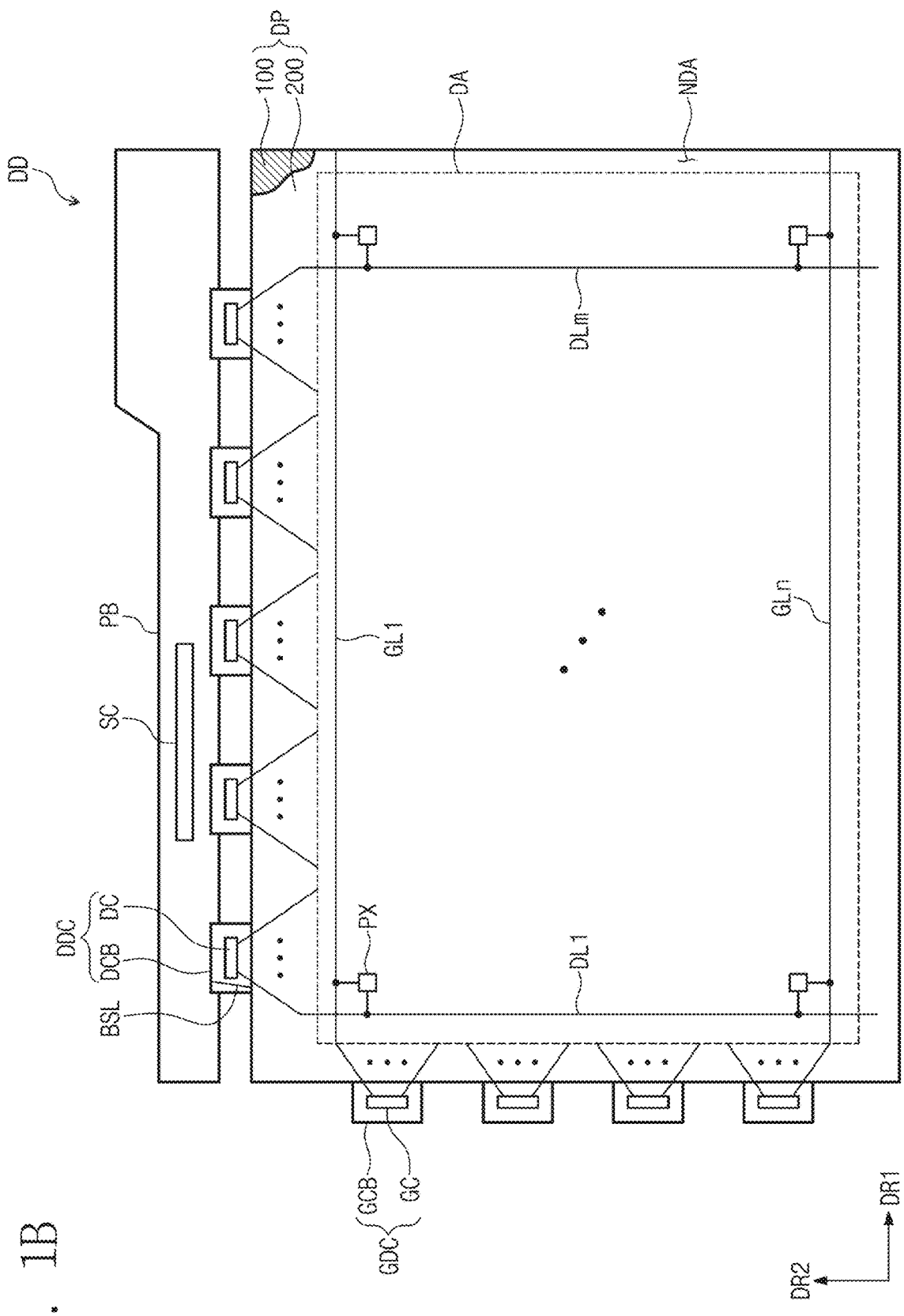
FIG. 1B is a plan view illustrating a display device according to an exemplary embodiment of the present invention.
Figure 2:
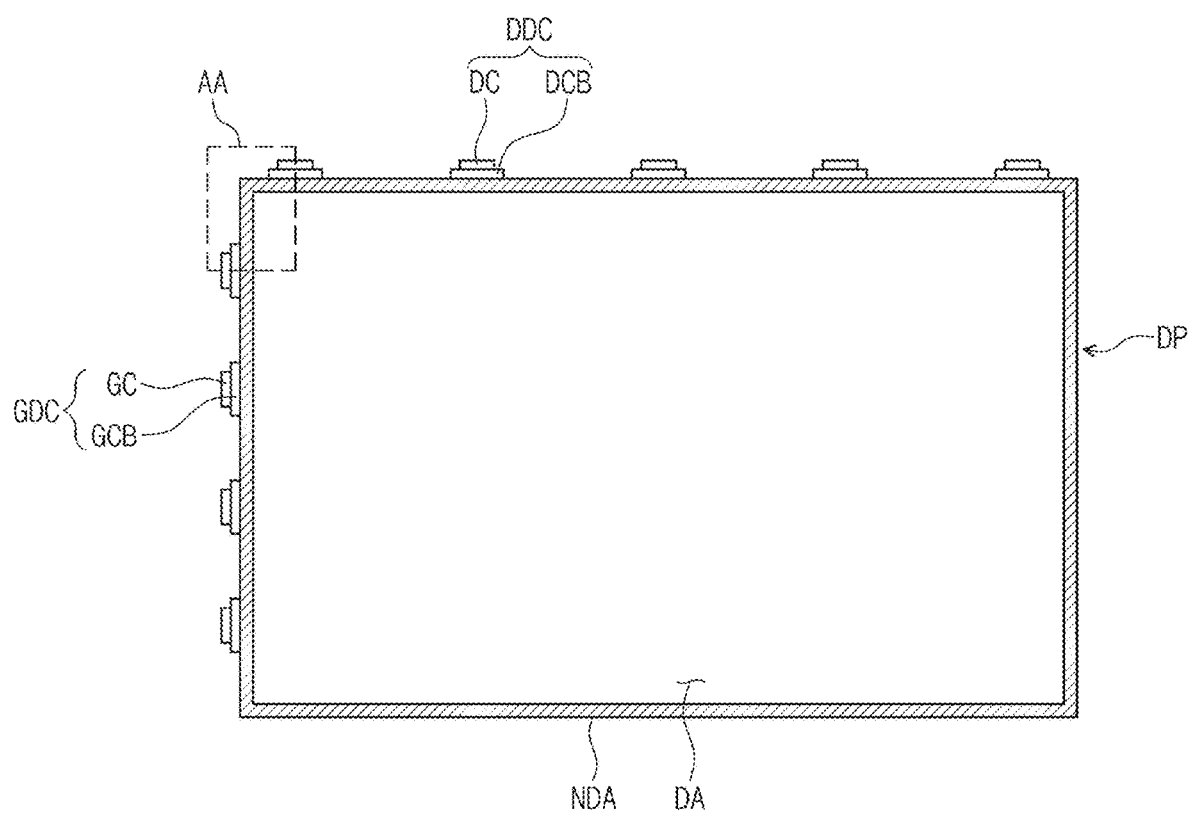
FIG. 2 is a plan view illustrating a display device according to an exemplary embodiment of the present invention.

FIG. 1A is a perspective view illustrating a display device according to an exemplary embodiment of present invention. FIG. 1B is a plan view illustrating a display device according to the same exemplary embodiment. FIG. 2 is a plan view illustrating a display device according to an exemplary embodiment of the present invention.

Referring to FIG. 1A, a display device DD may include a display panel DP, a main circuit board PB, gate members GDC, and data members DDC.

According to some exemplary embodiments of the present invention, the display device DD may be applied to middle-large-sized electronic devices (e.g., notebook computers and televisions) and small-sized electronic devices (e.g., portable phones, tablets, game consoles, and smart watches).

The display panel DP may include a first display substrate 100 and a second display substrate 200 facing the first display substrate 100. Each of the first and second display substrates 100 and 200 may include a glass substrate or a plastic substrate. However, the inventive concepts are not limited thereto. In certain exemplary embodiments, each of the first and second display substrates 100 and 200 may include at least one of various flexible, bendable, or foldable materials.

The display panel DP may be parallel to a plane defined by a first direction DR1 and a second direction DR2. A normal direction of the display panel DP may be indicated by a third direction DR3. The third direction DR3 may indicate a thickness direction of the display device DD. A front surface and a rear surface of each of components may be distinguished by the third direction DR3. However, the directions DR1, DR2, and DR3 may be relative concepts and may be rearranged in various ways.

According to some exemplary embodiments of the present invention, the display panel DP may be an organic light emitting display panel, a liquid crystal display panel, a plasma display panel, an electrophoretic display panel, a microelectromechanical system (MEMS) display panel, or an electrowetting display panel.

Referring to FIG. 1B, the display panel DP including the first and second display substrates 100 and 200 may include a display area DA and a bezel area NDA adjacent to the display area DA. In this exemplary embodiment, the bezel area NDA surrounds the display area DA in a plan view. However, the inventive concepts are not limited thereto. In certain exemplary embodiments, the bezel area NDA may be adjacent to one side of the display area DA, or may be omitted altogether.

The first display substrate 100 may include a plurality of gate lines GL1 to GLn, a plurality of data lines DL1 to DLm intersecting the gate lines GL1 to GLn, and a plurality of pixels PX connected to the gate lines GL1 to GLn and the data lines DL1 to DLm. The gate lines GL1 to GLn may be connected to the gate members GDC. The data lines DL1 to DLm may be connected to the data members DDC. In FIG. 1B, some of the gate lines GL1 to GLn, some of the data lines DL1 to DLm, and some of the pixels PX are illustrated for the purpose of ease and convenience in description and illustration.

The pixels PX may be classified into a plurality of groups on the basis of colors displayed by the pixels PX. In other words, each of the pixels PX may display one of primary colors. The primary colors may include a red color, a green color, a blue color, and a white color. However, the inventive concepts are not limited thereto. In another exemplary embodiment, the primary colors may further include other various colors, such as a yellow color, a cyan color, and a magenta color.

A signal controller SC may be mounted on the main circuit board PB to output various driving signals necessary to drive the display panel DP. For example, the signal controller SC may generate a gate control signal for controlling the gate members GDC in response to an external control signal and may transmit the gate control signal to the gate members GDC. The signal controller SC may generate a data control signal for controlling the data members DDC in response to the external control signal and may transmit the data control signal to the data members DDC.

The gate members GDC may generate gate signals based on the gate control signal during a plurality of frame intervals. The gate members GDC may output the gate signals to the gate lines GL1 to GLn. The gate signals may be sequentially outputted to correspond to horizontal intervals. In addition, even though not shown in the drawings, a plurality of gate circuit boards GCB may be electrically connected to each other.

In the present exemplary embodiment, the display device DD includes a plurality of the gate members GDC. However, the inventive concepts are not limited thereto. In another exemplary embodiment, the gate member GDC may be provided as a single gate member and may generate the gate signals. For example, the display device DD including the single gate member may be applied to a mobile phone.

Each of the gate members GDC may include a gate driving chip GC and a gate circuit board GCB on which the gate driving chip GC is mounted. The gate circuit board GCB may be a flexible printed circuit board, and the number of the gate circuit board GCB may correspond to the number of the gate driving chip GC.

The data members DDC may generate gray scale voltages according to image data provided from the signal controller SC on the basis of the data control signal received from the signal controller SC. The data members DDC may output the gray scale voltages (e.g., data signals) to the data lines DL1 to DLm.

In the present exemplary embodiment, the display device DD includes a plurality of the data members DDC. However, the inventive concepts are not limited thereto. In other words, the data member DDC may be provided as a single data member and may generate the gray scale voltages. For example, the display device DD including the single data member may be applied to a mobile phone.

Each of the data members DDC may include a data driving chip DC and a data circuit board DCB on which the data driving chip DC is mounted. The data circuit board DCB may be a flexible printed circuit board. The data circuit board DCB may electrically connect the main circuit board PB to the first display substrate 100. The data driving chip DC may be electrically connected to corresponding ones of the plurality of data lines DL1 to DLm.

The gate control signal outputted from the signal controller SC may be provided to the gate circuit board GCB via one of the data circuit boards DCB, which is closest to the gate circuit board GCB. In order to accomplish this, the data circuit board DCB may include an auxiliary dummy line BSL for transmitting the gate control signal outputted from the signal controller SC to the gate circuit board GCB.

According to an exemplary embodiment of the present invention, the gate members GDC may be disposed on one side surface of the first display substrate 100 and one side surface of the second display substrate 200, which are aligned with each other. The gate members GDC may be provided in a tape carrier package (TCP) type.

According to an exemplary embodiment of the present invention, the data members DDC may be disposed on another side surface of the first display substrate 100 and another side surface of the second display substrate 200, which are aligned with each other. The data members DDC may be provided in a tape carrier package (TCP) type.

Referring to FIG. 2, the gate members GDC may be disposed on one side surface of the display panel DP, and the data members DDC may be disposed on another side surface of the display panel DP. Here, the one side surface and the other side surface of the display panel DP may correspond to the one side surface and the other side surface of the first display substrate 100 or the second display substrate 200, respectively.

Meanwhile, if gate members GDC and the data members DDC are disposed on a top surface of the first display substrate 100, not the side surfaces of the first display substrate 100, pad parts electrically connected to the gate and data members GDC and DDC may be disposed on the top surface of the first display substrate 100. Since the pad parts are disposed on the top surface of the first display substrate 100, an area of the bezel area NDA may be increased by areas of the pad parts.

However, according to this exemplary embodiment of the present invention, the gate and data circuit boards GCB and DCB may be disposed on the side surfaces of the display panel DP, and thus, pad parts may be omitted from the top surface of the first display substrate 100. As a result, the bezel area NDA may be reduced by areas of the pad parts.

Figure 3A:
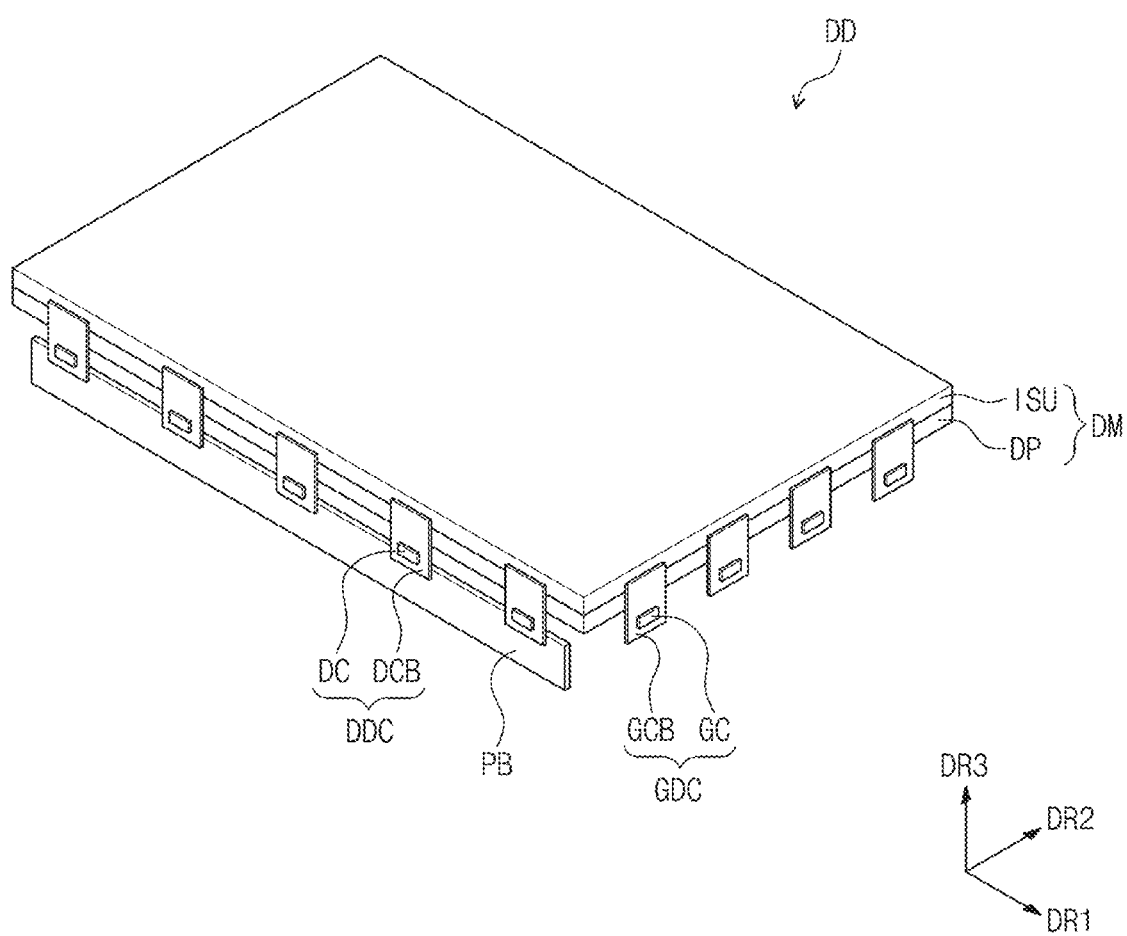
FIG. 3A is a perspective view illustrating a display device according to an exemplary embodiment of present invention.
Figure 3B:
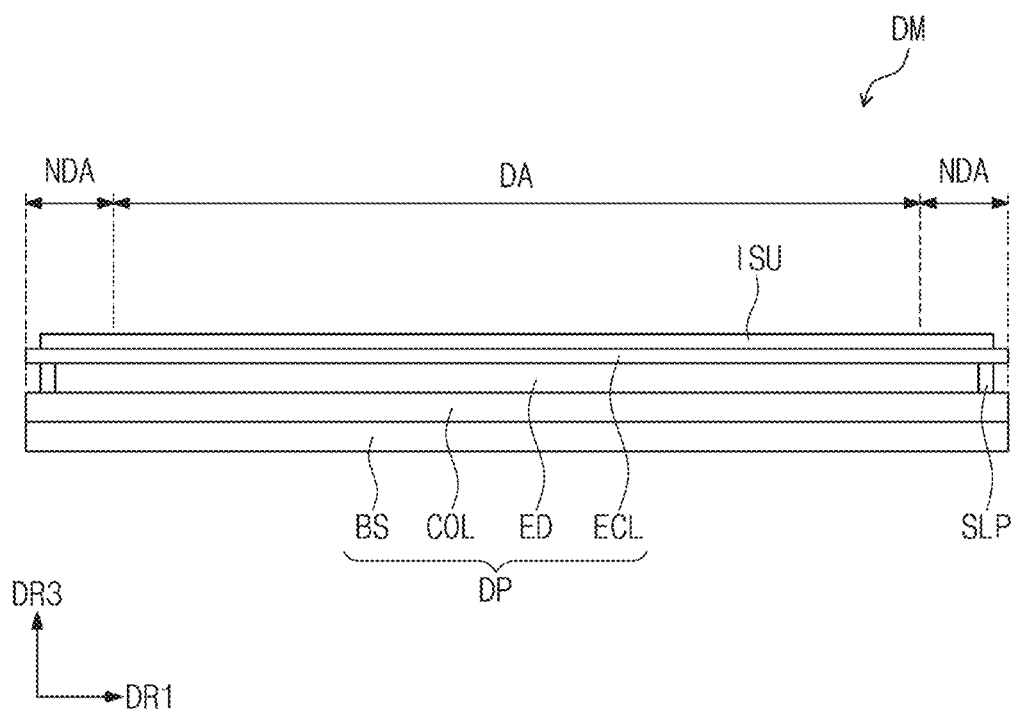
FIG. 3B is a cross-sectional view illustrating a display module of FIG. 3A.

FIG. 3A is a perspective view illustrating a display device according to an exemplary embodiment of the present invention. FIG. 3B is a cross-sectional view illustrating a display module of FIG. 3A.

Referring to FIG. 3A, a display device DD may include a display module DM, a main circuit board PB, gate members GDC, and data members DDC. The main circuit board PB, the gate members GDC, and the data members DDC may be substantially the same as described with reference to FIGS. 1A and 1B, and thus, detailed descriptions thereto will be omitted.

According to an exemplary embodiment of the present invention, the gate members GDC may be disposed on one side surface of the display module DM, and the data members DDC may be disposed on another side surface of the display module DM. In other words, the gate members GDC and the data members DDC may be disposed on the one side surface and the other side surface of the display module DM to transmit electrical signals to the display module DM.

Referring to FIG. 3B, the display module DM may include a display panel DP and an input sensing unit ISU.

The display panel DP may include a substrate BS, a circuit layer COL, a display element layer ED, and an encapsulation member ECL. The display panel DP may include a display area DA and a bezel area NDA.

The substrate BS may support components of the display panel DP and the input sensing unit ISU and may include a flexible material. For example, the substrate BS may include a plastic substrate, a glass substrate, or an organic/inorganic composite substrate. Alternatively, the substrate BS may have a stack structure including a plurality of insulating layers. The plastic substrate may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

The circuit layer COL may include a plurality of insulating layers, a plurality of conductive layers, and a semiconductor layer. The plurality of conductive layers of the circuit layer COL may include signal lines and/or a control circuit of a pixel.

The display element layer ED may overlap with the display area DA and may be disposed on the substrate BS. The display element layer ED may include display elements, e.g., organic light emitting diodes. However, the inventive concepts are not limited thereto. In another exemplary embodiment, the display element layer ED may include liquid crystal display elements, according to a kind of the display panel DP.

The encapsulation member ECL may encapsulate the display element layer ED. For example, the encapsulation member ECL may overlap with the display area DA and the bezel area NDA. In an exemplary embodiment, the encapsulation member ECL may be an encapsulation substrate. The encapsulation member ECL may protect the display element layer ED from a foreign material such as moisture, oxygen and/or dust particles. The encapsulation member ECL may be coupled to the substrate BS by a sealing member SLP. The sealing member SLP may include a frit. However, the material of the sealing member SLP is not limited thereto.

For example, when the encapsulation member ECL is the encapsulation substrate, the encapsulation member ECL may correspond to the second display substrate 200 described with reference to FIG. 1A.

The input sensing unit ISU may overlap with the display area DA and may be disposed on the encapsulation member ECL.

In FIG. 3B, the input sensing unit ISU may be formed directly on the encapsulation member ECL by continuous processes. However, the inventive concepts are not limited thereto. In another exemplary embodiment, an adhesive member (not shown) may be provided between the input sensing unit ISU and the encapsulation member ECL, and the input sensing unit ISU may be adhered to the encapsulation member ECL by the adhesive member.

Figure 4:
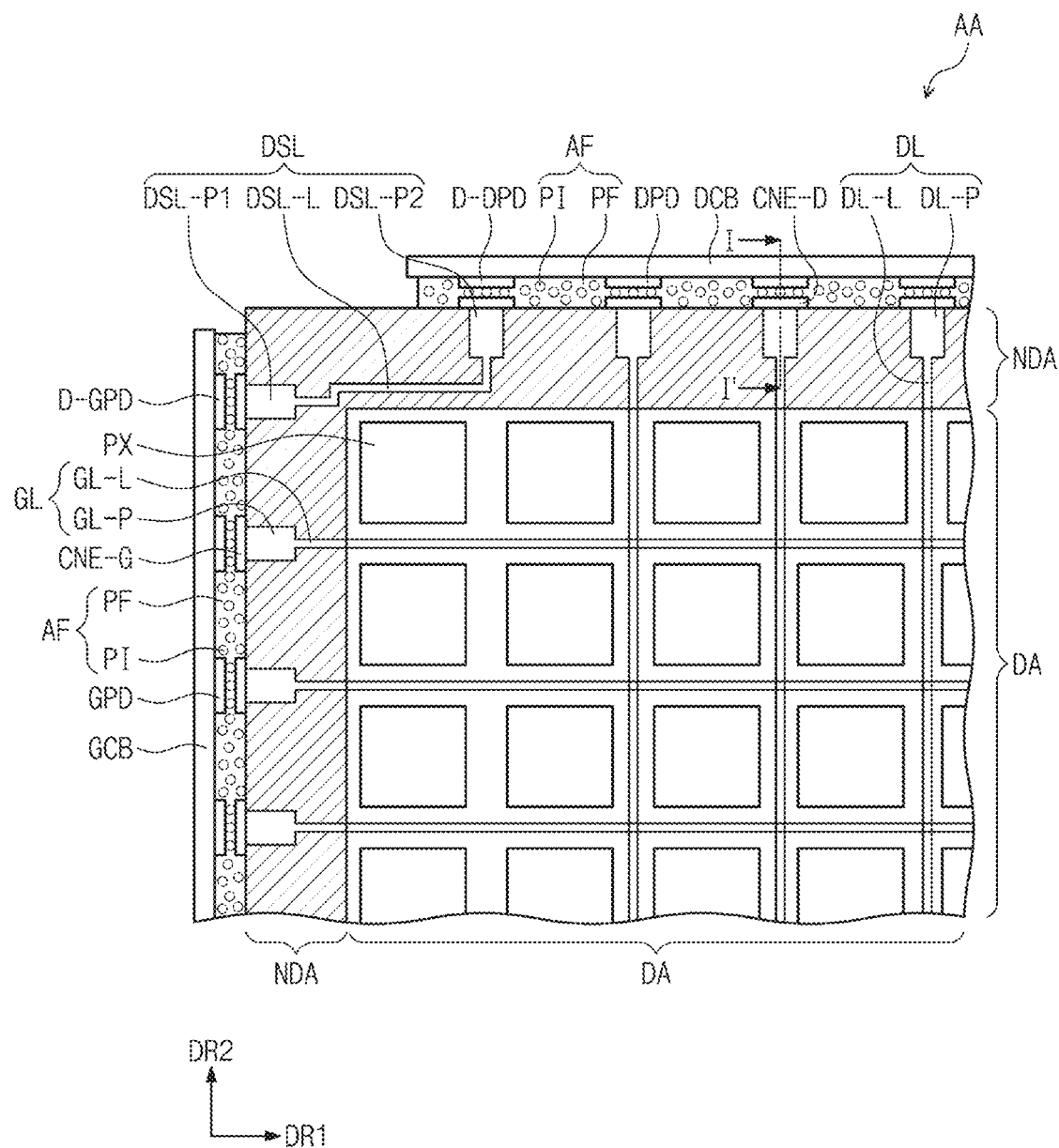
FIG. 4 is an enlarged plan view of an area 'AA' of FIG. 2.

FIG. 4 is an enlarged plan view of an area "AA" of FIG. 2.

FIG. 4 illustrates one of the gate members GDC connected to the display panel DP in FIG. 1B and one of the data members DDC connected to the display panel DP in FIG. 1B for the purpose of ease and convenience in description. In addition, the gate driving chip GC mounted on the gate circuit board GCB and the data driving chip DC mounted on the data circuit board DCB are omitted in FIG. 4.

Referring to FIG. 4, the display panel DP may include a plurality of signal lines overlapping with the display area DA and the bezel area NDA. Here, the signal lines may include the data lines DL and the gate lines GL described in FIG. 1B and may also include a dummy line DSL electrically connected to the auxiliary dummy line BSL of FIG. 1B.

Each of the data lines DL may include a data pad portion DL-P and a data line portion DL-L. The data line portion DL-L may overlap with the display area DA and the bezel area NDA. The data pad portion DL-P may overlap with the bezel area NDA and may be connected to an end of the data line portion DL-L.

The dummy line DSL may overlap with the bezel area NDA and may include a gate dummy pad portion DSL-P1, a data dummy pad portion DSL-P2, and a dummy line portion DSL-L connecting the gate dummy pad portion DSL-P1 and the data dummy pad portion DSL-P2. The gate dummy pad portion DSL-P1 may be connected to one end of the dummy line portion DSL-L, and the data dummy pad portion DSL-P2 may be connected to another end of the dummy line portion DSL-L. The data dummy pad portion DSL-P2 may be closer to the gate circuit board GCB than the data pad portion DL-P. Meanwhile, one dummy line DSL is illustrated in FIG. 4 for the purpose of ease and convenience in description. However, in other exemplary embodiments, a plurality of the dummy line DSL may be provided.

The dummy line DSL may be electrically connected to the auxiliary dummy line BSL disposed on the data circuit board DCB. Thus, the dummy line DSL may transmit the gate control signal provided through the auxiliary dummy line BSL to the gate circuit board GCB. The gate driving chip GC disposed on the gate circuit board GCB may output corresponding gate signals to the gate lines GL in response to the gate control signal transmitted through the dummy line DSL.

Each of the gate lines GL may include a gate pad portion GL-P and a gate line portion GL-L. The gate line portion GL-L may overlap with the display area DA and the bezel area NDA. The gate pad portion GL-P may overlap with the bezel area NDA and may be connected to an end of the gate line portion GL-L.

As illustrated in FIG. 4, the data member DDC may further include a plurality of data driving pads DPD and a first dummy driving pad D-DPD in addition to the data circuit board DCB and the data driving chip DC described above. The number of the data driving pads DPD may correspond to the number of the data lines DL electrically connected to one data circuit board DCB.

The data driving pads DPD may be electrically connected to the data lines DL, respectively. The data driving pads DPD may receive data voltages from the data driving chip DC, respectively. The first dummy driving pad D-DPD may be electrically connected to the dummy line DSL and may receive the gate control signal from the signal controller SC. In other words, the gate control signal may be transmitted to the dummy line DSL through the first dummy driving pad D-DPD.

The gate member GDC may further include a plurality of gate driving pads GPD and a second dummy driving pad D-GPD in addition to the gate circuit board GCB and the gate driving chip GC described above. The number of the gate driving pads GPD may correspond to the number of the gate lines GL electrically connected to one gate circuit board GCB.

The gate driving pads GPD may be electrically connected to the gate lines GL, respectively. The gate driving pads GPD may receive the gate signals from the gate driving chip GC, respectively. The second dummy driving pad D-GPD may be electrically connected to the dummy line DSL and may receive the gate control signal. The second dummy driving pad D-GPD may be electrically connected to the gate driving chip GC. The gate driving chip GC may receive the gate control signal through the second dummy driving pad D-GPD and may respectively output the gate signals to the gate driving pads GPD in response to the gate control signal.

According to an exemplary embodiment of the present invention, the display panel DP may further include gate connection electrodes CNE-G disposed on one side surface of the first display substrate 100 and data connection electrodes CNE-D disposed on another side surface of the first display substrate 100. The one side surface of the first display substrate 100 may face the gate circuit board GCB of the gate member GDC, and the other side surface of the first display substrate 100 may face the data circuit board DCB of the data member DDC.

An adhesive member AF may electrically adhere or bond the gate connection electrodes CNE-G to the gate driving pads GPD of the gate circuit board GCB. In addition, an adhesive member AF may electrically adhere or bond the data connection electrodes CNE-D to the data driving pads DPD of the data circuit board GCB. According to an exemplary embodiment of the present invention, the adhesive member AF may be an anisotropic conductive film (ACF). For example, the adhesive member AF may include an adhesive film PF having an adhesive property and conductive particles PI formed in the adhesive film PF. The conductive particles PI may electrically connect the gate connection electrodes CNE-G to the gate driving pads GPD, respectively, and may electrically connect the data connection electrodes CNE-D to the data driving pads DPD, respectively.

In the present exemplary embodiment, the adhesive member (i.e., the anisotropic conductive film) is described as a component for electrically adhering or bonding the driving pad of the circuit board and the connection electrode. However, the inventive concepts are not limited thereto. In other words, the driving pad of the circuit board and the connection electrode may be electrically connected to each other by various methods. In another exemplary embodiment, the driving pad and the connection electrode may be connected directly to each other by an ultrasonic method or a soldering method.

Figure 5:
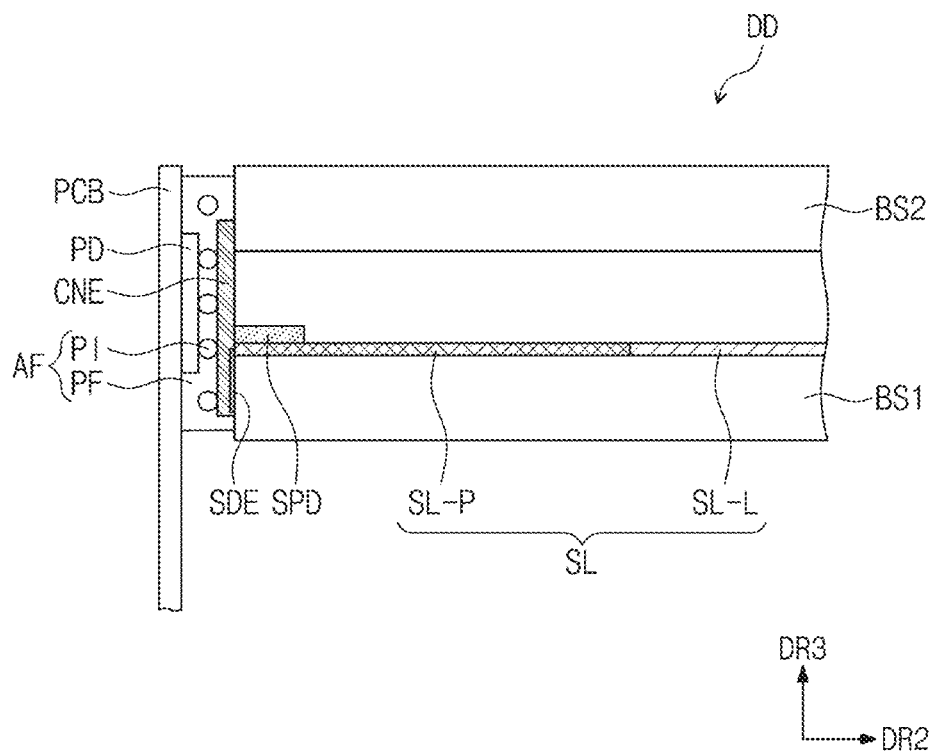
FIG. 5 is a cross-sectional view taken along a line I-I' of FIG. 4.
Figure 6:
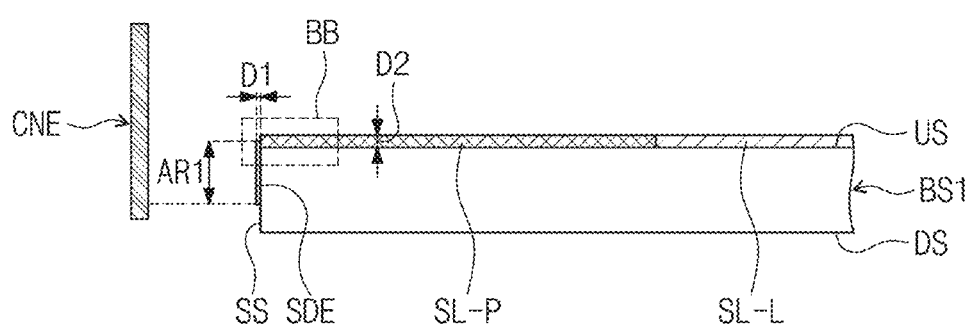
FIG. 6 is a cross-sectional view illustrating a first substrate according to an exemplary embodiment of present invention.
Figure 7:
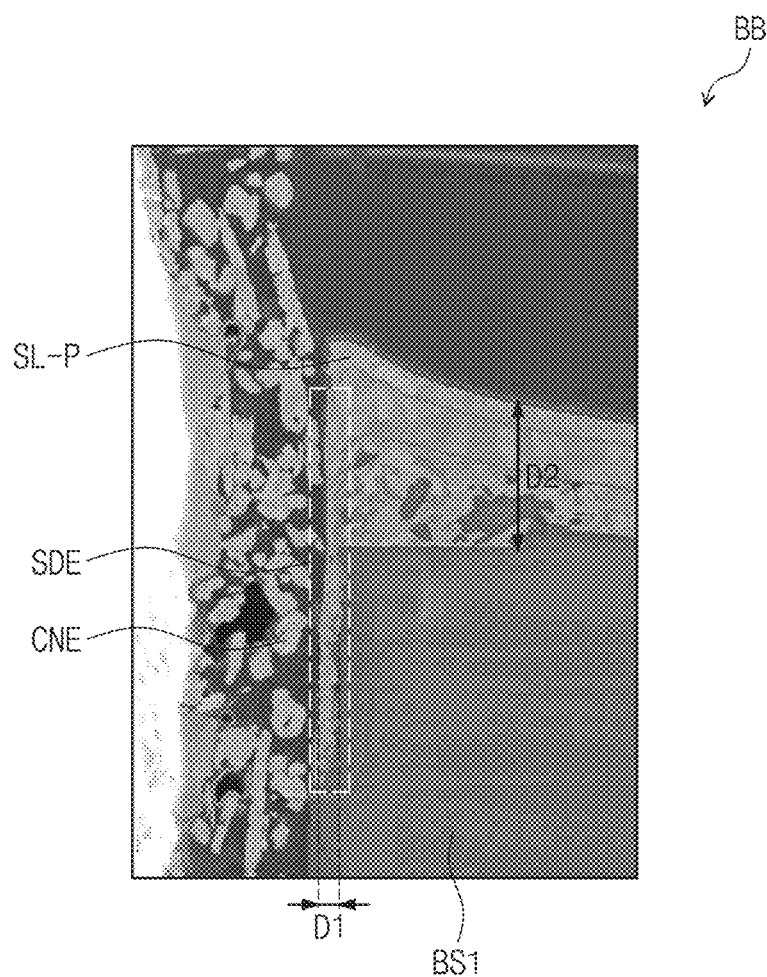
FIG. 7 is an enlarged view of an area 'BB' of FIG. 6.

FIG. 5 is a cross-sectional view taken along a line I-I' of FIG. 4. FIG. 6 is a cross-sectional view illustrating a first substrate according to an exemplary embodiment of the present invention. FIG. 7 is an enlarged view of an area 'BB' of FIG. 6.

Referring to FIG. 5, the display panel DP may include a first substrate BS1, a second substrate BS2, a signal line SL, a sidewall electrode SDE, an auxiliary electrode SPD, and a connection electrode CNE.

In FIG. 5, the first substrate BS1 may be a component included in the first display substrate 100 illustrated in FIG. 1A. For example, the first substrate BS1 may correspond to the substrate BS illustrated in FIG. 3B, and the first display substrate 100 may include the first substrate BS1, and the circuit layer COL and the display element layer ED disposed on the first substrate BS1. The second substrate BS2 may be a component included in the second display substrate 200 illustrated in FIG. 1A.

The signal line SL may be the data line DL illustrated in FIG. 4, and the connection electrode CNE may be the data connection electrode CNE-D illustrated in FIG. 4. However, the inventive concepts are not limited thereto. In another exemplary embodiment, the signal line SL may be the gate line GL, and the connection electrode CNE may be the gate connection electrode CNE-G. The connection electrode CNE may include a conductive material formed of silver (Ag), carbon (C), or copper (Cu).

A circuit board PCB and a driving pad PD illustrated in FIG. 5 may be the data circuit board DCB and the data driving pad DPD illustrated in FIG. 4, respectively. However, the inventive concepts are not limited thereto. In another exemplary embodiment, the circuit board PCB and the driving pad PD may be the gate circuit board GCB and the gate driving pad GPD illustrated in FIG. 4, respectively.

The first substrate BS1 may include a first top surface US, a first bottom surface DS, and a first side surface SS connecting the first top surface US and the first bottom surface DS (see FIG. 6). The first side surface SS of the first substrate BS1 may include a first sub-side surface and a second sub-side surface opposite to each other in the first direction DR1, and a third sub-side surface and a fourth sub-side surface opposite to each other in the second direction DR2.

The second substrate BS2 may include a second top surface, a second bottom surface, and a second side surface connecting the second top surface and the second bottom surface. The first top surface US of the first substrate BS1 may face the second bottom surface of the second substrate BS2. The second side surface of the second substrate BS2 may include first to fourth sub-side surfaces. According to an exemplary embodiment of the present invention, the first sub-side surface of the first side surface SS and the first sub-side surface of the second side surface may be aligned with each other in the third direction DR3 and may face the circuit board PCB.

The signal line SL may be disposed on the first top surface US of the first substrate BS1 and may include a line portion SL-L and a pad portion SL-P. One end of the pad portion SL-P may be connected to the line portion SL-L, and another end of the pad portion SL-P may be aligned with an edge of the first substrate BS1.

The connection electrode CNE may be disposed on the first sub-side surface of the first side surface SS and the first sub-side surface of the second side surface, which are aligned with each other. The connection electrode CNE may be electrically connected to the driving pad PD of the circuit board PCB through the adhesive member AF.

The auxiliary electrode SPD may be in electrical contact with a top surface of the pad portion SL-P, and an end of the auxiliary electrode SPD may be aligned with the first sub-side surface of the first side surface SS. For example, the auxiliary electrode SPD may be in electrical contact with the connection electrode CNE. In this case, the sidewall electrode SDE may be in electrical contact with the pad portion SL-P. For another example, the auxiliary electrode SPD may be in electrical contact with the connection electrode CNE and the sidewall electrode SDE. Electrical characteristics between the connection electrode CNE and the pad portion SL-P may be improved by the auxiliary electrode SPD.

A driving signal provided from the driving pad PD of the circuit board PCB may be transmitted to the connection electrode CNE through the conductive particles PI of the adhesive member AF. The driving signal transmitted to the connection electrode CNE may be transmitted to the pad portion SL-P of the signal line SL. The driving signal transmitted to the signal line SL may be provided to the pixel PX (see FIG. 4). For example, the driving signal may be the gate signal or the data voltage.

According to an exemplary embodiment of the present invention, the sidewall electrode SDE may be disposed on the first sub-side surface of the first side surface SS. The sidewall electrode SDE may face the circuit board PCB and may be in electrical contact with the pad portion SL-P and the connection electrode CNE. The connection electrode CNE may be in contact with a portion of the sidewall electrode SDE or may be in contact with an entire portion of the sidewall electrode SDE.

If the sidewall electrode SDE disposed on the first sub-side surface of the first side surface SS is omitted, the connection electrode CNE may be in electrical contact with the pad portion SL-P. In this case, a contact area between the connection electrode CNE and the pad portion SL-P may be small to cause a reduction in reliability of electrical connection between the connection electrode CNE and the pad portion SL-P.

However, according to this exemplary embodiment of the present invention, the reliability of the electrical connection between the connection electrode CNE and the pad portion SL-P may be improved by the sidewall electrode SDE.

In detail, referring to FIG. 6, the sidewall electrode SDE may be disposed on the first side surface SS of the first substrate BS1 and may be in electrical contact with the pad portion SL-P. The sidewall electrode SDE may overlap with the connection electrode CNE when viewed in the second direction DR2. In particular, an overlapping area AR between the sidewall electrode SDE and the connection electrode CNE may be greater than an overlapping area between the connection electrode CNE and the pad portion SL-P of the signal line SL. In other words, connection reliability when the connection electrode CNE is electrically connected to the pad portion SL-P through the sidewall electrode SDE may be improved more than connection reliability when the connection electrode CNE is electrically connected to only the pad portion SL-P.

As a result, the driving signal provided from the circuit board PCB may be reliably transmitted to the circuit layer COL and the display element layer ED disposed on the first substrate BS1, and thus, overall driving reliability of the display device DD may be improved.

In addition, according to an exemplary embodiment of the present invention, a thickness of the sidewall electrode SDE may be less than a thickness of the pad portion SL-P. According to an exemplary embodiment of the present invention, the signal line SL may be formed on the first substrate BS1 by a patterning process, but the sidewall electrode SDE may be formed on the first side surface SS of the first substrate BS1 by a grinding process. As a result, the thickness of the sidewall electrode SDE may be less than the thickness of the pad portion SL-P. This will be described in more detail with reference to FIG. 10A.

Referring to FIG. 7, the sidewall electrode SDE may be formed on the first side surface SS of the first substrate BS1 by the grinding process using a grinder. As a result, a thickness D1 of the sidewall electrode SDE may be less than a thickness D2 of the pad portion SL-P.

Moreover, the connection electrode CNE may include a conductive material formed of silver (Ag), carbon (C), or copper (Cu). In particular, a process of forming the connection electrode CNE on the side surface of the first substrate BS1 may be performed by a method of depositing the conductive material and irradiating laser to the deposited conductive material to form the electrode, or a silk screen method.

Figure 8:
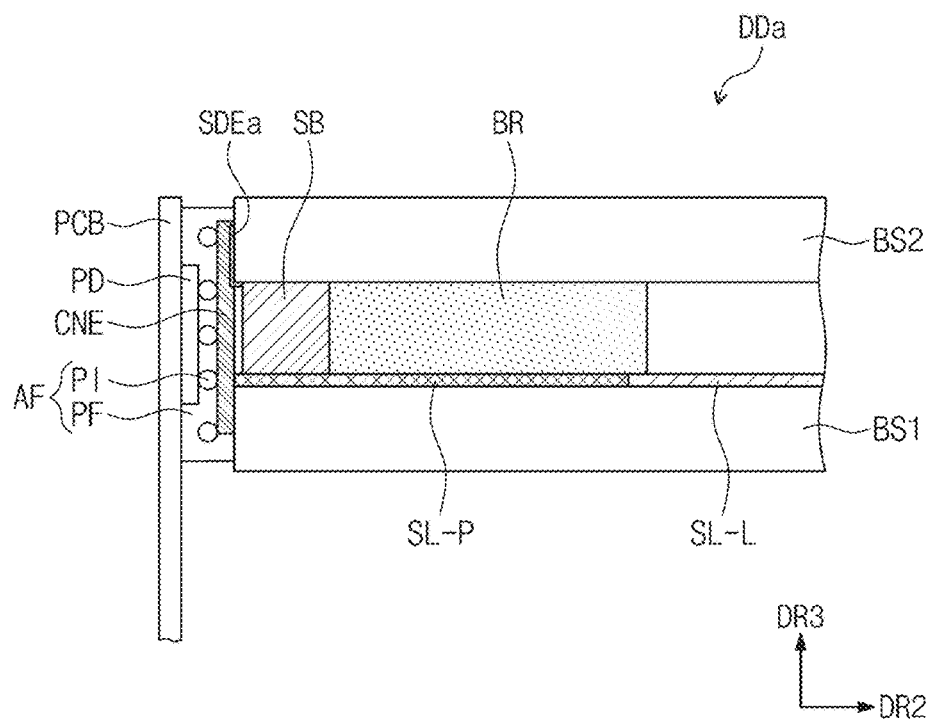
FIG. 8 is a cross-sectional view illustrating a display device according to an exemplary embodiment of present invention.
Figure 9:
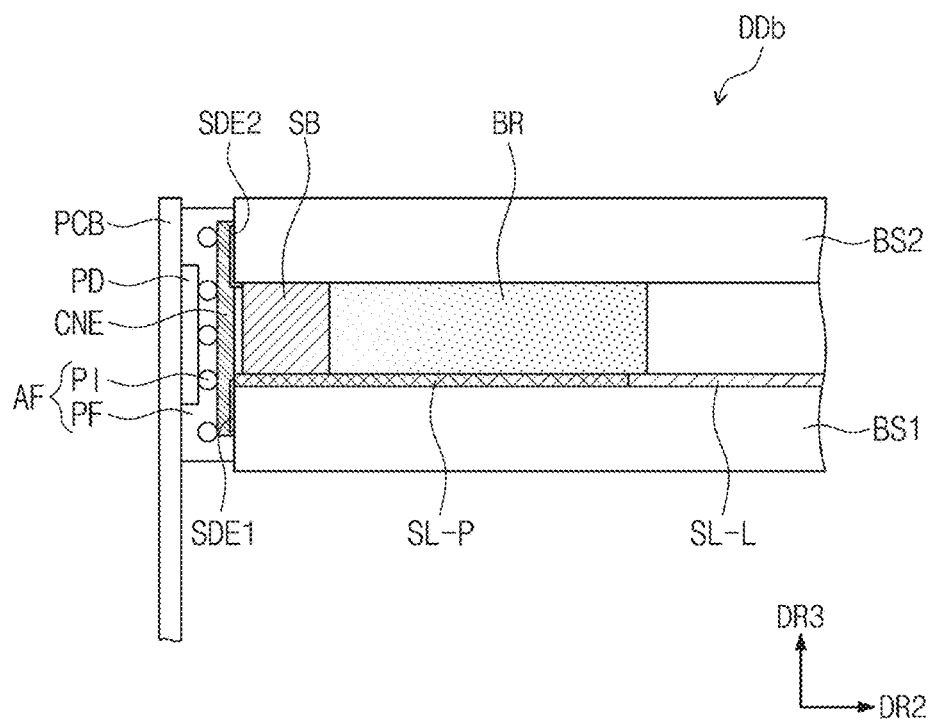
FIG. 9 is a cross-sectional view illustrating a display device according to an exemplary embodiment of present invention.

FIG. 8 is a cross-sectional view illustrating a display device according to an exemplary embodiment of the present invention. FIG. 9 is a cross-sectional view illustrating a display device according to another exemplary embodiment of the present invention.

A sidewall electrode SDEa of a display device DDa of FIG. 8 may be different from the sidewall electrode SDE of the display device DD of FIG. 5, and the display device DDa of FIG. 8 may further include a sealing member SB and a partition BR as compared with the display device DD of FIG. 5. Other components of the display device DDa may be substantially the same as corresponding components of the display device DD of FIG. 5, and thus, the descriptions thereto will be omitted.

Referring to FIG. 8, a first side surface of the first substrate BS1 may face the circuit board PCB, and a side surface of the second substrate BS2 may be aligned with the first side surface of the first substrate BS1 and may face the circuit board PCB.

According to an exemplary embodiment of the present invention, the sidewall electrode SDEa may be disposed on the side surface and a bottom surface of the second substrate BS2. The side surface of the second substrate BS2 may be aligned with the first side surface of the first substrate BS1. In detail, the sidewall electrode SDEa may include a first sidewall portion disposed on the side surface of the second substrate BS2, and a second sidewall portion extending from the first sidewall portion and disposed on the bottom surface of the second substrate BS2. A length of the first sidewall portion may be greater than a length of the second sidewall portion. The first sidewall portion of the sidewall electrode SDEa may face the circuit board PCB in the second direction DR2, and the second sidewall portion of the sidewall electrode SDEa may face the pad portion SL-P.

According to an exemplary embodiment of the present invention, a thickness of the sidewall electrode SDEa may be less than a thickness of the pad portion SL-P. According to an exemplary embodiment of the present invention, the pad portion SL-P and the line portion SL-L of the signal line SL may be formed on the first substrate BS1 by a patterning process, but the sidewall electrode SDEa may be formed on the side surface and the bottom surface of the second substrate BS2 by a grinding process. As a result, the thickness of the sidewall electrode SDEa may be less than the thickness of the pad portion SL-P. This will be described in more detail with reference to FIG. 10A.

In addition, an overlapping area between the connection electrode CNE and the first sidewall portion of the sidewall electrode SDEa may be greater than an overlapping area between the connection electrode CNE and the pad portion SL-P.

The sealing member SB may be disposed between the first and second substrates BS1 and BS2 to connect the first and second substrates BS1 and BS2 and may be in electrical contact with the second sidewall portion of the sidewall electrode SDEa. The sealing member SB may be conductive and may transmit an electrical signal provided from the sidewall electrode SDEa to the pad portion SL-P.

The partition BR may be disposed between the first and second substrates BS1 and BS2 to connect the first and second substrates BS1 and BS2. The partition BR may be further from the first side surface of the first substrate BS1 in the second direction DR2 than the sealing member SB. In other words, the first substrate BS1 may have a second side surface opposite to the first side surface in the second direction DR2, and the partition BR may be further from the first side surface in a direction toward the second side surface than the sealing member SB.

The partition BR may include an insulating material and may prevent the electrical signal of the sealing member SB from being transmitted to the display element layer ED (see FIG. 3B) disposed on the first substrate BS1. For example, the partition BR may include an organic material.

A display device DDb of FIG. 9 may further include a first sidewall electrode SDE1 disposed on a first side surface of the first substrate BS1, as compared with the display device DDa of FIG. 8. Other components of the display device DDb may be substantially the same as corresponding components of the display device DDa of FIG. 8, and thus, the descriptions thereto will be omitted.

Referring to FIG. 9, a first side surface of the first substrate BS1 may face the circuit board PCB, and a second side surface of the second substrate BS2 may be aligned with the first side surface of the first substrate BS1 and may face the circuit board PCB. According to the inventive concepts, the first substrate BS1 may be defined as a lower substrate, and the second substrate BS2 may be defined as an upper substrate.

A first sidewall electrode SDE1 may be disposed on the first side surface of the first substrate BS1, and a second sidewall electrode SDE2 may be disposed on the second side surface of the second substrate BS2. According to the inventive concepts, the first sidewall electrode SDE1 may be defined as a lower sidewall electrode, and the second sidewall electrode SDE2 may be defined as an upper sidewall electrode.

The first sidewall electrode SDE1 disposed on the first side surface of the first substrate BS1 may be substantially the same as the sidewall electrode SDE of FIG. 5, and the second sidewall electrode SDE2 disposed on the second side surface of the second substrate BS2 may be substantially the same as the sidewall electrode SDEa of FIG. 8.

According to an embodiment of the present invention, the connection electrode CNE may be in electrical contact with the first sidewall electrode SDE1 and the second sidewall electrode SDE2.

Figure 10A:
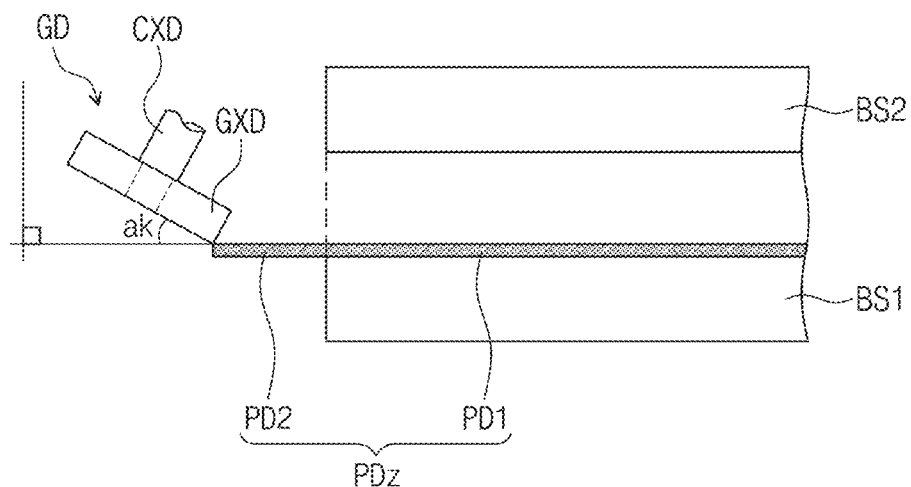
FIG. 10A and FIG. 10B are cross-sectional views illustrating a method for manufacturing a display device, according to an exemplary embodiment of present invention.
Figure 10B:
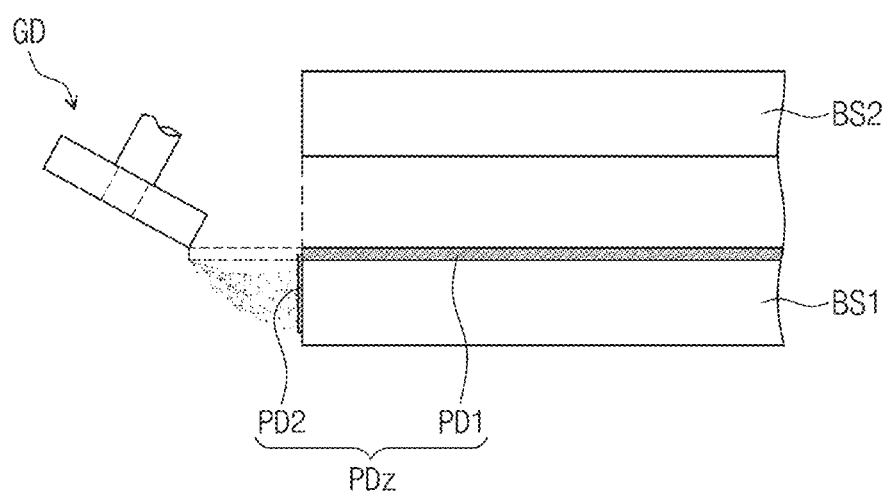
Figure 11A:
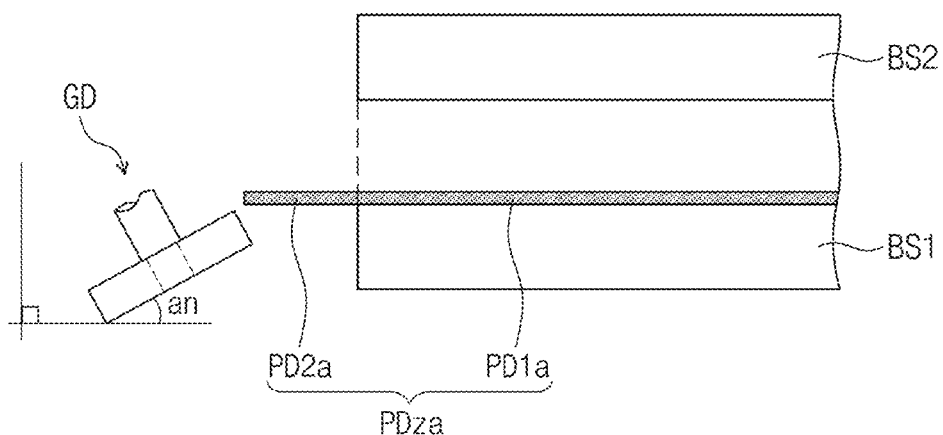
FIG. 11A and FIG. 11B are cross-sectional views illustrating a method for manufacturing a display device, according to an exemplary embodiment of present invention.
Figure 11B:
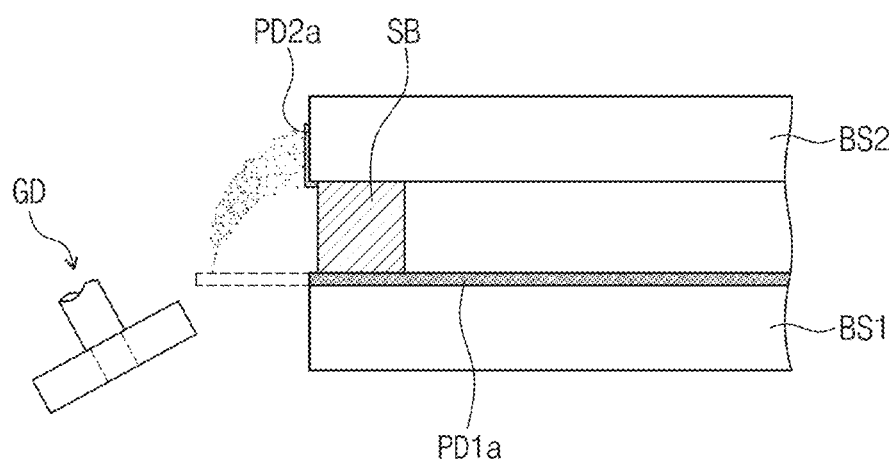

FIGS. 10A and 10B are cross-sectional views illustrating a method for manufacturing a display device, according to an exemplary embodiment of the present invention. FIGS. 11A and 11B are cross-sectional views illustrating a method for manufacturing a display device, according to an exemplary embodiment of the present invention.

A grinder GD may include a grinding member GXD and a rotation member CXD. The grinding member GXD may come in direct contact with an object to be ground to perform a grinding process on the object. The grinding member GXD may include a cylinder-shaped recess therein. For example, the grinding member GXD may include a diamond having a high degree of hardness. However, the inventive concepts are not limited thereto. In other exemplary embodiments, the grinding member GXD may include at least one of a variety of materials.

The rotation member CXD may be coupled to the recess of the grinding member GXD. The rotation member CXD may transmit rotational force to the grinding member GXD such that the grinding member GXD rotates about a rotation axis at a high speed to perform the grinding process. Even though not shown in the drawings, the rotation member CXD may be connected to an electric motor (not shown) driven by external power and may be rotated by the electric motor to transmit the rotational force to the grinding member GXD.

A method of forming the sidewall electrode on the first side surface of the first substrate BS1 in FIGS. 5 and 9 will be described with reference to FIGS. 10A and 10B.

A pad electrode PDz may include a first portion PD1 and a second portion PD2 extending from the first portion PD1. The first portion PD1 of the pad electrode PDz may be formed on the top surface of the first substrate BS1. The first portion PD1 and the second portion PD2 may extend in one direction. The second portion PD2 may not overlap with the first substrate BS1 and the second substrate BS2.

According to an exemplary embodiment of the present invention, the second portion PD2 may be ground by the grinding member GXD and, at the same time, the ground second portion PD2 may be formed on the first side surface of the first substrate BS1. In this case, the grinding member GXD of the grinder GD may continuously perform the grinding process from an end of the second portion PD2 to a boundary between the first and second portions PD1 and PD2. As a result, since the second portion PD2 is ground, an exposed portion of the first portion PD1 may be aligned with the first side surface of the first substrate BS1.

In particular, the grinding member GXD may grind the second portion PD2 in a state in which the grinding member GXD perpendicular to the rotation axis makes a predetermined angle ak with the top surface of the first substrate BS1. The predetermined angle ak may be an acute angle. In addition, the grinding member GXD may be disposed on the pad electrode PDz to grind the second portion PD2. As a result, as illustrated in FIG. 10B, the second portion PD2 ground by the grinding member GXD may be formed on the first side surface of the first substrate BS1.

The first portion PD1 described in FIGS. 10A and 10B may correspond to the signal line SL illustrated in FIG. 5, and the second portion PD2 may correspond to the sidewall electrode SDE illustrated in FIG. 5.

A method of forming the sidewall electrode on the side surface and the bottom surface of the second substrate BS2 will be described with reference to FIGS. 11A and 11B. Here, a method of forming the sidewall electrode on the bottom surface of the second substrate BS2 may be omitted. In this case, the sidewall electrode may be formed on only the side surface of the second substrate BS2.

Likewise, a pad electrode PDza including a first portion PD1a and a second portion PD2a extending from the first portion PD1a may be formed on the top surface of the first substrate BS1. The second portion PD2a may not overlap with the first substrate BS1 and the second substrate BS2.

According to an exemplary embodiment of the present invention, the second portion PD2a may be ground by the grinding member GXD and, at the same time, the ground second portion PD2a may be formed on the side surface and the bottom surface of the second substrate BS2. In this case, the grinding member GXD of the grinder GD may continuously perform the grinding process from an end of the second portion PD2a to a boundary between the first and second portions PD1a and PD2a. As a result, since the second portion PD2a is ground, the first portion PD1a and the second portion PD2a may be separated from each other. In other words, the first portion PD1a may be disposed on the first substrate BS1, and the second portion PD2a may be disposed on the second substrate BS2.

In addition, the grinding member GXD may grind the second portion PD2a in a state in which the grinding member GXD perpendicular to the rotation axis makes a predetermined angle an with the top surface of the first substrate BS1. The predetermined angle an may be an acute angle. In addition, the grinding member GXD may be disposed under the pad electrode PDza to grind the second portion PD2a. As a result, as illustrated in FIG. 11B, the second portion PD2a ground by the grinding member GXD may be formed on the side surface and the bottom surface of the second substrate BS2.

Figure 12:
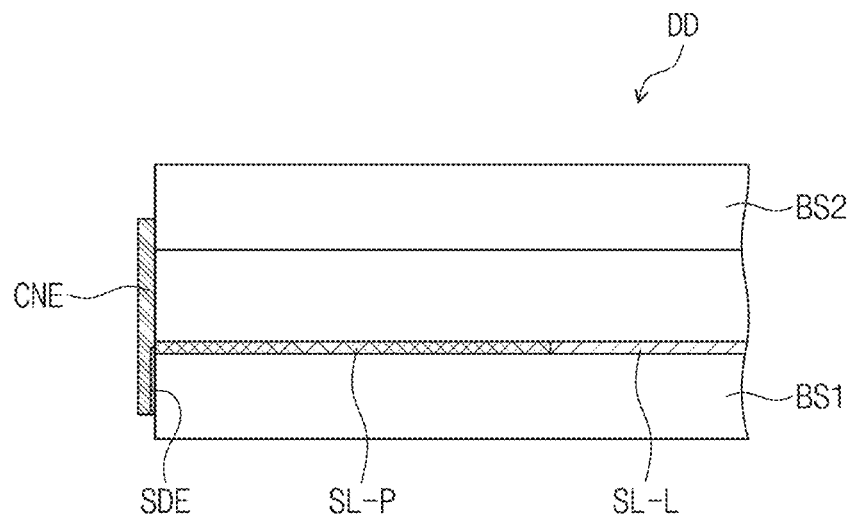
FIG. 12 is a cross-sectional view illustrating a method for manufacturing a display device according to an exemplary embodiment of present invention.
Figure 12:
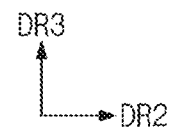
Figure 13:
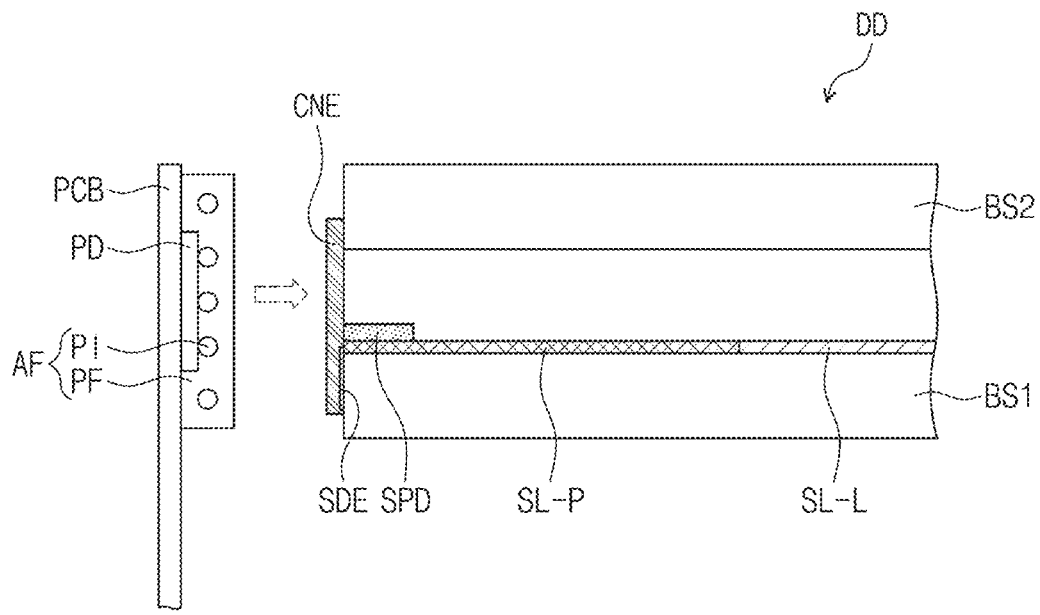
FIG. 13 is a cross-sectional view illustrating a method for manufacturing a display device according to an exemplary embodiment of present invention.
Figure 13:
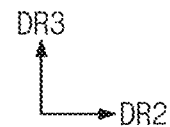

FIG. 12 is a cross-sectional view illustrating a method for manufacturing a display device, according to an exemplary embodiment of the present invention. FIG. 13 is a cross-sectional view illustrating a method for manufacturing a display device, according to an exemplary embodiment of the present invention.

Referring to FIGS. 10B and 12, the connection electrode CNE may be formed on the first side surface of the first substrate BS1 so as to be in electrical contact with the second portion PD2. At this time, the connection electrode CNE may be formed on the first side surface of the first substrate BS1 and a second side surface of the second substrate BS2.

Thereafter, referring to FIG. 13, the circuit board PCB to which the adhesive member AF is adhered may be connected to the connection electrode CNE. In other words, the adhesive member AF may electrically connect the connection electrode CNE to the driving pad PD included in the circuit board PCB.

According to the inventive concepts, the connection area between the display panel and the circuit board may be increased to easily transmit the electrical signal generated from the circuit board to the display panel. As a result, the driving reliability of the display device may be improved.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate comprising a top surface, a bottom surface, and a plurality of side surfaces connecting the top surface and the bottom surface;
   a signal line disposed on the top surface;
   a sidewall electrode in electrical contact with the signal line and disposed on a first side surface of the side surfaces; and
   a connection electrode in electrical contact with the sidewall electrode and disposed on the first side surface,
   wherein a thickness of the sidewall electrode is less than a thickness of the signal line.

2. The display device of claim 1, wherein an overlapping area between the connection electrode and the sidewall electrode is greater than an overlapping area between the connection electrode and the signal line.

3. The display device of claim 1, further comprising an auxiliary electrode disposed on the signal line and in electrical contact with the signal line and the connection electrode.

4. The display device of claim 1, further comprising:
   an upper substrate facing the substrate;
   an upper sidewall electrode disposed on a side surface of the upper substrate, which is aligned with the first side surface; and
   a sealing member disposed between the substrate and the upper substrate and electrically connecting the upper sidewall electrode to the signal line.

5. The display device of claim 4, wherein the connection electrode is in electrical contact with the sidewall electrode of the substrate and the upper sidewall electrode of the upper substrate.

6. The display device of claim 4, wherein a thickness of the upper sidewall electrode is less than a thickness of the signal line.

7. The display device of claim 4, further comprising a partition disposed between the substrate and the upper substrate, the partition being arranged further from the first side surface than the sealing member and in a direction toward a second side surface opposite to the first side surface.

8. The display device of claim 7, wherein the partition comprises an organic material.

9. The display device of claim 4, wherein an overlapping area between the connection electrode and the upper sidewall electrode is greater than an overlapping area between the connection electrode and the signal line.

10. The display device of claim 4, further comprising an input sensing unit disposed on the upper substrate.

11. The display device of claim 1, further comprising:
    a circuit board comprising a driving pad and facing the first side surface; and
    an adhesive member electrically adhering the driving pad to the connection electrode.

12. A display device comprising:
    a first substrate comprising a top surface, a bottom surface, and a plurality of side surfaces connecting the top surface and the bottom surface;
    a second substrate facing the top surface of the first substrate;
    a signal line disposed on the top surface;
    a sidewall electrode disposed on a side surface of the second substrate which is aligned with a first side surface of the side surfaces of the first substrate;
    a sealing member disposed between the first substrate and the second substrate and electrically connecting the sidewall electrode to the signal line;
    a circuit board comprising a driving pad and facing the first side surface and the side surface of the second substrate;
    a connection electrode in electrical contact with the sidewall electrode and disposed on the first side surface and the side surface of the second substrate; and
    an adhesive member electrically adhering the driving pad to the connection electrode,
    wherein a thickness of the sidewall electrode is less than a thickness of the signal line.

13. The display device of claim 12, wherein:
    the sidewall electrode comprises:
        a first sidewall portion disposed on the side surface of the second substrate; and
        a second sidewall portion extending from the first sidewall portion and disposed on a bottom surface of the second substrate; and
    the second sidewall portion is in electrical contact with the sealing member.

14. The display device of claim 13, wherein an overlapping area between the connection electrode and the first sidewall portion of the sidewall electrode is greater than an overlapping area between the connection electrode and the signal line.

15. The display device of claim 12, further comprising a partition disposed between the first substrate and the second substrate, the partition being arranged further from the first side surface than the sealing member and in a direction toward a second side surface opposite to the first side surface.

16. A method for manufacturing a display device, the method comprising:
 forming a first portion of a pad electrode on a top surface of a substrate, the pad electrode comprising the first portion extending in one direction; and a second portion extending from the first portion;
 forming the second portion on a side surface of the substrate by grinding the second portion using a grinder;
 forming a connection electrode on the side surface of the substrate such that the connection electrode is in electrical contact with the second portion; and
 electrically connecting the connection electrode to a driving pad of a circuit board facing the side surface of the substrate by using a conductive adhesive member.

17. The method of claim 16, wherein the grinder comprises:
 a grinding member configured to grind the second portion; and
 a rotation member connected to the grinding member and configured to rotate the grinding member according to a rotation axis,
 wherein the grinding member grinds the second portion in a state in which the grinding member perpendicular to the rotation axis makes a predetermined angle with the top surface of the substrate.

18. The method of claim 17, wherein the predetermined angle is an acute angle.

* * * * *